United States Patent [19]

Ghanbari et al.

[11] Patent Number: 5,455,197
[45] Date of Patent: Oct. 3, 1995

[54] CONTROL OF THE CRYSTAL ORIENTATION DEPENDENT PROPERTIES OF A FILM DEPOSITED ON A SEMICONDUCTOR WAFER

[75] Inventors: Abe Ghanbari, W. Nyack; Michael Ameen, Cornwall, both of N.Y.

[73] Assignee: Materials Research Corporation, Orangeburg, N.Y.

[21] Appl. No.: 93,058

[22] Filed: Jul. 16, 1993

[51] Int. Cl.$^6$ .................. H01L 21/283; C23C 14/35
[52] U.S. Cl. .................. 437/192; 437/190; 437/225; 437/245; 204/192.13; 204/192.17; 204/298.03; 204/298.2
[58] Field of Search .................. 437/192, 190, 437/225, 245; 204/192.13, 192.17, 298.03, 298.2, 298.21

[56] References Cited

U.S. PATENT DOCUMENTS

| | | | |
|---|---|---|---|
| 4,046,660 | 9/1977 | Fraser | 204/192 |
| 4,309,266 | 1/1982 | Nakamura et al. | 204/298 |
| 4,441,974 | 4/1984 | Nishikawa et al. | 204/192 |
| 4,567,700 | 2/1986 | Snook | 52/219 |
| 4,622,121 | 11/1986 | Wegmann et al. | 204/298 |
| 4,624,767 | 11/1986 | Obinata | 204/298 |
| 4,661,228 | 4/1987 | Mintz | 204/192.25 |
| 4,761,219 | 8/1988 | Sasaki et al. | 204/298 |
| 4,865,712 | 9/1989 | Mintz | 204/298 |
| 4,871,433 | 10/1989 | Wagner et al. | 204/192.12 |
| 4,895,765 | 1/1990 | Sue et al. | 428/627 |
| 4,906,347 | 3/1990 | Tomita et al. | 204/298 |
| 4,931,158 | 6/1990 | Bunshah et al. | 204/192.29 |
| 4,963,524 | 10/1990 | Yamazaki | 505/1 |
| 4,999,096 | 3/1991 | Nihei et al. | 204/192.3 |
| 5,080,772 | 1/1992 | Hurwitt et al. | 204/192.12 |
| 5,085,755 | 2/1992 | Setoyama et al. | 204/298.16 |
| 5,120,417 | 6/1992 | Takahashi et al. | 204/192.12 |
| 5,126,028 | 6/1992 | Hurwitt et al. | 204/192.13 |
| 5,130,005 | 7/1992 | Hurwitt et al. | 204/192.12 |
| 5,175,608 | 12/1992 | Nihei et al. | 257/751 |
| 5,234,560 | 8/1993 | Kadlec et al. | 204/192.12 |
| 5,252,194 | 10/1993 | DeMaray et al. | 204/298.2 |

*Primary Examiner*—T. N. Quach
*Attorney, Agent, or Firm*—Wood, Herron & Evans

[57] ABSTRACT

A method of controlling the crystal orientation dependent properties, such as residual stress, barrier layer effectiveness and resistivity, of reactively sputtered films such as titanium nitride, provide a method of optimizing the design parameters of the deposition apparatus and a method of utilizing the apparatus to produce coated Wafers. A sputtering target is maintained spaced from a wafer with a rotating magnetic field produced by a magnet rotating behind the target. An auxiliary magnet is provided at the wafer to unbalance the target magnetic field and allow ion flux from the plasma to reach the substrate. A film is deposited and the properties of the resulting film measured, particularly, in the case of titanium nitride deposition, the ratio of <200> to <111> crystal orientation, as well as the ratio uniformity. The auxiliary magnet configuration and target to wafer spacing are varied and the ratio remeasured. The variation and measurement are repeated until the ratio and ratio uniformity are achieved. Then the apparatus design is set and wafers manufactured therewith having the desired properties.

17 Claims, 2 Drawing Sheets

CONTROL OF THE CRYSTAL ORIENTATION DEPENDENT PROPERTIES OF A FILM DEPOSITED ON A SEMICONDUCTOR WAFER

The present invention relates to the control of film properties during their deposition onto semiconductor wafers, such as in the reactive deposition of titanium nitride. More particularly, the present invention relates to methods of providing a vacuum deposition apparatus and depositing a film therewith while controlling properties of the film, such as resistivity, stress and diffusion barrier effectiveness, of films such as titanium nitride, that are dependent on crystal orientations of the deposited film.

BACKGROUND OF THE INVENTION

The manufacture of semiconductor wafers typically involves a series of processes for the blanket and selective deposition of a plurality of layers of material on a substrate, for the patterning and etching of the deposited layers, and for other treatment. The purposes of each of the various layers on the wafer are the fulfilled as a result of the locations or patterns of the film material on the wafer and as a result of the properties of the materials of which the layers are made.

For example, some films are deposited for their conductivity and are used for carrying current in the semiconductor devices or circuits formed on the wafer. Other films are deposited for their insulative properties or for the wide variety of semiconductor properties on which device characteristics depend. Still other films are employed as boundary layers between two other layers, serving as diffusion barriers to control the migration of material from one layer into another. The properties that the films possess depend not only on the composition of the material of which the film is formed but on physical and other characteristics of the film, which may vary with the conditions under which the film is deposited.

Titanium nitride (TIN), for example, is capable of providing properties that give it a variety of important uses. Important among these uses is that of a diffusion barrier in VLSI metallization technology. The properties that make titanium nitride films desirable for use as diffusion barriers in microelectronic devices are its relative inertness, its high melting point, its thermal Stability, its low resistivity and its resistance to alloying with aluminum at temperatures of up to 500° C.

Polycrystaline TiN films are deposited by a variety of techniques, including reactive DC and RF magnetron sputtering, ion plating, activated reactive evaporation, and chemical vapor deposition (CVD). Each technique, depending on the processing parameters, can produce a TiN film with different physical properties. For example, variation in resistivities from 25 to 4500 $\mu\Omega$ cm and crystal orientations of <111> and <200>, in various proportions, may result. Generally, properties of interest in the use of TiN films for semiconductor diffusion barriers are uniformity, resistivity, stress and crystal orientation. Many of the properties desired are those that are related to, or in part a function of, crystal orientation.

The correlation between the resulting properties of a deposited film and the process parameters that produce the film are capable of being determined by experimentation. The production of films with certain desired properties by controlling the process parameters is sometimes achievable in a laboratory setting with varying degrees of difficulty. Absent from the art of semiconductor manufacture, however, are methods and equipment that produce semiconductor wafers on a commercial scale having films of which the most desired properties, particularly properties related to film Crystal orientation, can be controlled.

Accordingly, there is a need for a method and apparatus for controlling the properties of deposited thin films on semiconductor wafers, particularly for controlling resistivity, stress, diffusion barrier effectiveness, as well as crystal orientation per se and other properties dependent thereon, for titanium nitride and films which also possess the properties described herein.

SUMMARY OF THE INVENTION

A primary objective of the present invention is to provide a method and apparatus for controlling the properties of thin films during their deposition onto semiconductor wafers. It is a particular objective of the present invention to provide a method for controlling those properties of deposited films that are dependent on crystal orientations throughout the deposited film, and, more particularly, for providing a film having a given or predetermined crystal orientation of a given uniformity over the surface of the wafer.

A further objective of the present invention is to provide a method of producing a semiconductor wafer processing apparatus configured in such a way as to deposit films having the given crystal orientation over the surfaces of the wafers.

A further objective of the present invention is to provide a method of manufacturing semiconductor wafers having controlled crystal orientation dependent properties. A particular objective of the present invention is to provide a method and apparatus for controlling properties such as uniformity, resistivity, stress, and other crystal Orientation dependent properties of deposited films, such as titanium nitride, used as diffusion barriers in commercial semiconductor wafer production.

In accordance with the principles of the present invention, a magnetron sputter coating apparatus is provided with a wafer support maintained in spaced relationship with a target of sputter Coating material that has a tendency to form a film on the surface of a wafer having one or more of a plurality of possible crystal orientations.

In addition, the main magnetron producing magnet is behind the target and preferably of a rotating permanent magnet type that traps and rotates a plasma over the target surface. Further, an auxiliary magnet is provided in the vicinity of the wafer, for example, as a ring shaped magnet surrounding the periphery of the wafer, to provide an auxiliary magnetic field that has a field component perpendicular to the surface of the wafer, thereby unbalancing the field of the magnetron to allow ion flux to flow from the plasma onto the wafer surface.

In accordance with the present invention, a method is provided by which, by measuring the crystal orientation of the film deposited by the apparatus onto a wafer, preferably at various radii from the center of the wafer and axis of main magnet rotation, the magnet configuration and wafer-to-target spacing are adjusted. Then, wafers are coated and measured, and further adjustments are made to the spacing and to the magnet configuration, until a desired crystal orientation of a desired uniformity across the wafer surface is achieved. The adjustments so established may then be fixed, and the adjusted apparatus then used to commercially coat wafers with film layers having the desired crystal orientation. As a result, properties that are dependant on crystal orientation are controlled at desired levels.

The present invention is particularly suitable and advantageous for controlling the properties of titanium nitride (TiN) film deposited by reactive sputtering, wherein the properties of resistivity, stress and boundary effectiveness as a diffusion barrier may vary in accordance with the ratio of <200> to <111> crystal orientation on the wafer surface. The sputter deposition of TiN typically employs a process of sputtering a target of titanium in the presence of a mixture of an inert gas such as argon and the reactive gas, nitrogen. The nitrogen component of the gas may be introduced separately near the substrate surface.

With the preferred embodiment of the present invention, a rotating plasma is produced over the target surface, by a rotating magnet positioned behind the target, producing a closed magnetic field or trap that rotates over the target surface. Where a titanium target is so sputtered, ions from the plasma move toward and strike the target dislodging titanium material, which then travels to and impinges upon the wafer, along with a light flux of ions which flow from the plasma as a result of the unbalanced field caused by the countermagnet. At the surface of the wafer, the titanium reacts with nitrogen from the gas and forms a TiN film on the wafer.

The auxiliary magnet is, preferably, a solenoidal permanent or electromagnet, and may be shaped such as a counter-magnetic ring around the edge of the wafer. Plural magnets or magnet rings of different sizes and strengths may be employed to produce a field that has a component perpendicular to the wafer surface and varies with the distance from the center of the wafer. The auxiliary magnet enhances the flux of ions from the plasma onto the wafer, and does so at an energy level that is low and therefore does not damage the wafer.

In accordance with a preferred embodiment of the invention, the magnetron sputtering device is provided, at least during the measuring and adjusting phase thereof, with variable relative spacing between the target of coating material and the semiconductor wafer upon which the film is to be formed. Similarly, the device may be provided with a variable countermagnet, which generates a variable counter-magnetic field responsive to adjustments of the magnet. The countermagnet may, for example, be in the form of moveable permanent magnet rings around the perimeter of and behind the wafer, or in the form of an variable current electromagnet coil that surrounds the wafer. The counter-magnetic field is thereby variable, either by mechanical adjustment of countermagnet position using permanent countermagnets or by varying the current to the field winding of an electromagnet.

In accordance with the method of the invention, the desired properties are achieved by sputtering the film and adjusting the target-to-wafer spacing, while adjustments of the counter-magnetic field are also made, to produce the desired properties. Preferably, the desired properties are achieved by determining the variation in the desired properties which result when a film is deposited using the adjustably equipped apparatus, varying the target-to-wafer spacing and the counter-magnetic field, to produce the desired properties, and then fixing the adjustments for producing an apparatus design for commercial wafer production.

These and other objectives and advantages of the present invention will be apparent from the following detailed description of the drawings in which:

DETAILED DESCRIPTION OF THE DRAWINGS

Figure 1:
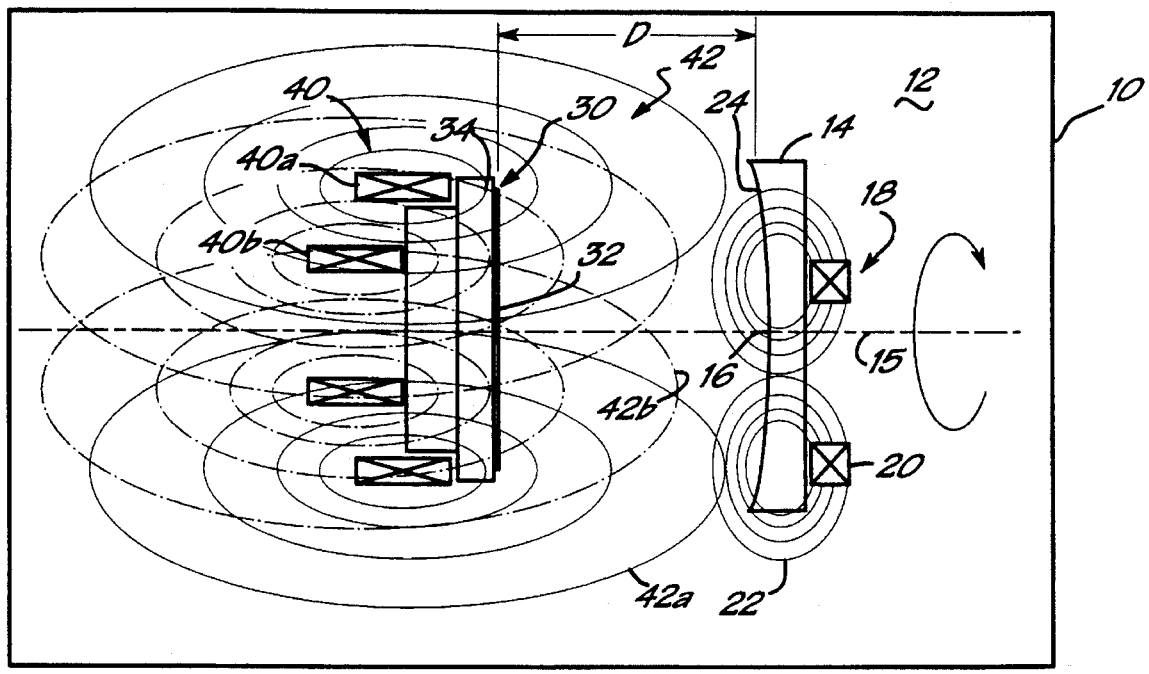
FIG. 1 is a cross sectional diagrammatic view of one embodiment a sputter coating apparatus according to the principles of the present invention, employing a rotating magnet magnetron and an electromagnet counter-magnetic winding.

Referring to FIG. 1, one version of a sputter deposition apparatus 10 embodying principles of the present invention is illustrated diagrammatically. The apparatus 10 includes a vacuum chamber 12 in which is mounted a sputter coating cathode assembly 14. The cathode assembly 14 includes a generally circular target of sputter coating material, which may be, for example, titanium metal. The target 14 has a shallow dish shaped sputtering surface 24 from which metal is sputtered. A longitudinal axis 15 is illustrated through the center 16 of the target 14. Behind the target 14 is a magnet assembly 18 on which is mounted a permanent magnet strip 20. The magnet strip 20 is formed in a closed loop, and generates a magnetic field 22, which forms a closed magnetic trap. When the target 14 is electrically energized, a plasma forms in the gas within the chamber 12 and is particularly confined within the trap formed by the magnetic field 42 over the sputtering surface 24 of the target 14. The magnet assembly 18 is rotatable about the axis 15 to rotate the magnetic field 22 and thereby sweep the plasma over the sputtering surface 24 of the target 14. A cathode assembly of this preferred type is more fully described in the commonly assigned U.S. Pat. No. 5,130,005 entitled MAGNETRON SPUTTER COATING METHOD AND APPARATUS WITH ROTATING MAGNET CATHODE, expressly incorporated herein by reference.

Spaced from the target 14 on the centerline or axis 15 and generally parallel to the sputtering surface 24 of the target 14 is a wafer support 30 on which is supported a single circular semiconductor wafer 32, with its center on the axis 15. The support 30 includes a backplane portion 34 which contains a wafer clamp or chuck (not shown) for holding the wafer 32 to the backplane 34 and a temperature control system (not shown), which may heat or cool the wafer 32 on the support 30. When supported on the support 30, the wafer 32 is maintained a distance D from the target surface 24.

Positioned in the proximity of the wafer 32, preferably surrounding the circular edge or periphery of the wafer 32, is a ring shaped auxiliary magnet 40, illustrated in FIG. 1 as including a solenoid electromagnet 40a. The magnet 40 is configured to produce a magnetic field 42 that has a component that is perpendicular to the wafer 32. The magnet 40 may be an assembly of magnets, such as also including magnet 40b, which cooperates with the magnet 40a to produce a resultant magnetic field 42, which is the sum of the respective fields 42a and 42b of the magnets 40a and 40b. Such a resultant field made up of a plurality of magnets can be controlled to vary in a desired manner as a function of the radius of the field from the axis 15. This control can be achieved by differently varying the polarities, strengths or shapes of each of the magnets of the assembly 40.

Figure 2:
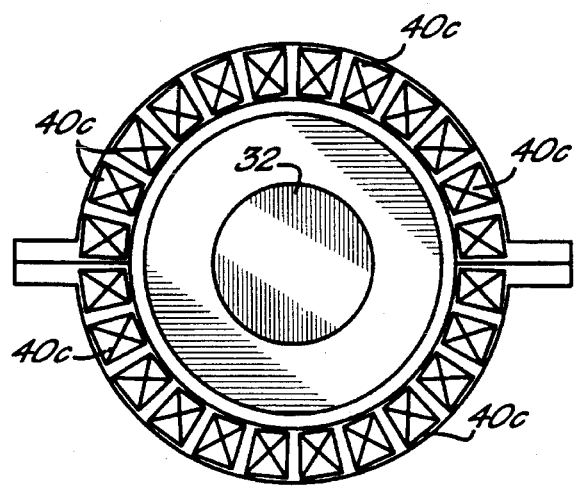
FIG. 2 is a cross sectional view along the line 2—2 of FIG. 1 illustrating an alternative embodiment of in which the countermagnet is a permanent magnet pack.

With electromagnets constituting the magnets 40, the field strengths may be varied by adjusting the currents to the magnet windings. Alternatively, permanent magnet packs, such as the magnet pack array 40c illustrated in FIG. 2, may be used to form an alternative version of the magnet assembly 40.

The provision of a sputter coating apparatus 10 in accordance with the principles of the present invention involves the application of a film onto a wafer 32, and then the measurement of the crystal orientation of the formed film across the surface of the wafer 32. In the reactive sputter deposition of titanium nitride, the target 14, which is of titanium metal, is sputtered by generating a plasma in the magnet trap formed within the field 22 to produce ions in the gas within the chamber 12. These ions bombard the surface 24 of the target 14, dislodging titanium particles which impinge onto the wafer 32. On the surface of the wafer 32, the titanium particles react with nitrogen, which is mixed with the neutral gas in the chamber 12, to form the TiN film. This film is capable of forming in either or both of two crystal orientations: <200> and <111>.

The ratio of the <200> crystal orientation to <111> crystal orientation in the film formed on the substrate 32 is responsible for a number of properties of the formed film, such as the stress state of the film, the electrical resistivity of the film or the effectiveness of the film as a diffusion barrier. The crystal orientation is affected, in the present invention, by the adjustment of the spacing D, and by the configuration of the auxiliary magnet 40. This crystal orientation is measured at various radii on the surface of the wafer 32.

Generally, certain properties are desired in the formed film that have a direct relation to the crystal orientation of the film, or to the ratio of <200> to <111> in the film. This orientation ratio will be preferably uniform over the surface of the wafer, or will deviate from perfect uniformity by a given degree. Accordingly, the measurements of the crystal orientation ratio are taken at various radii on the wafer surface. These measurements are used to evaluate adjustments in the wafer-to-target spacing D and to vary the configuration of the magnet 40. Accordingly, after adjustments are made, another wafer 32 is coated, the crystal orientation ratios are measured at different radii across its surface, and, if the desired crystal orientation ratio and uniformity thereof has not been achieved, the spacing and magnet configuration are again readjusted. The process is repeated until the desired crystal orientation ratio and ratio uniformity are achieved.

When the optimum values of D and magnet configuration are determined, they are established as the desired design parameters of the apparatus 10, to which the apparatus 10 is set for commercial production of coated wafers. These parameters may be fixed in the design of a commercial form of the apparatus 10 or may be set by providing variable spacing D in the apparatus 10 and variable magnet field configuration for the magnets 40, with the variables set to the determined values of spacing and magnet configuration. Variable magnet configuration may be achieved by providing moveable magnet parts 42 for the magnet 40, variable current to a coil of an electromagnetic form of the magnet 40, moveable pole pieces, or other forms of variable parameters that affect the shape and strength of the magnetic field produced.

Figure 3:
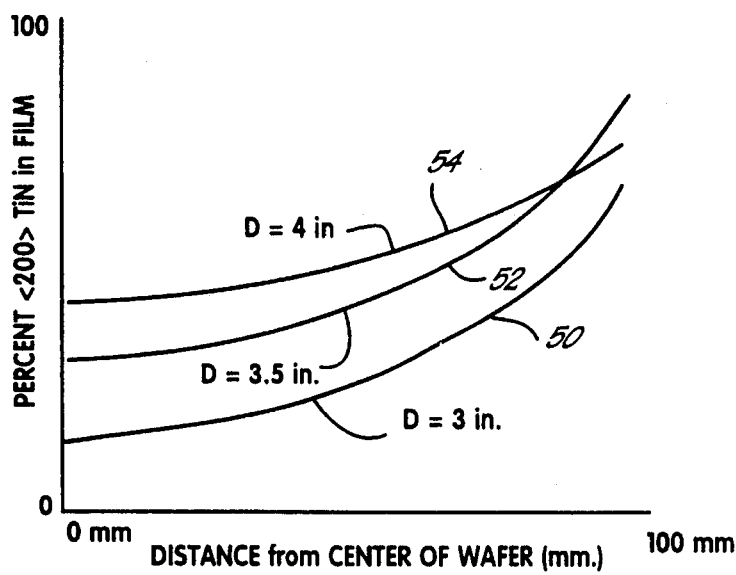
FIG. 3 is a graph illustrating the percentage of <200> crystal orientation in the deposited film as a function of distance from the center of the wafer for various wafer to target spacings
Figure 4:
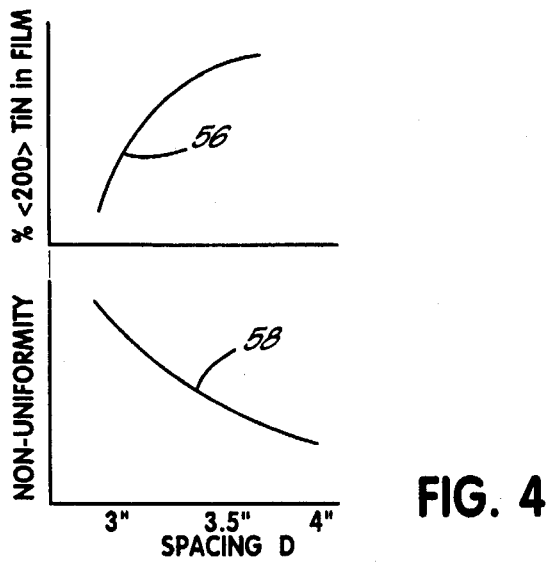
FIG. 4 is a graph illustrating the percentage of <200> crystal orientation in the deposited film and corresponding thickness uniformity of the film as functions of wafer to target spacing.

FIG. 3 is a graph illustrating the ratio of <200> to <111> crystal orientation in a TiN film deposited by reactive sputtering in the apparatus 10, without the presence of the auxiliary magnet 40 and, therefore, no counter-magnetic field 42. In this example, the first curve 50 represents the ratio for wafer-to-target spacing D of 3 inches, showing a tendency for the ratio to increase as radius increases from the center axis 15 to the edge of a 200 mm diameter wafer 32. As illustrated, with 3.0 inch spacing D, the ratio of <200> crystal orientation in the film is low. As illustrated in curve 52, with a 3.5 inch spacing D, the ratio increases from that of curve 50 over the entire wafer surface. With an increase of the spacing D further to 4 inches as shown in curve 54, the ratio of <200> crystal orientation in the film increases at the center and intermediate radii, but decreases somewhat near the wafer rim, reflecting better uniformity. This phenomenon of increasing <200> to <111> crystal orientation ratio and increasing uniformity, (decreasing ratio variation or non-uniformity over the surface of the wafer) with increasing wafer-to-target spacing D is illustrated by graphs 56 and 58, respectively, of FIG. 4.

Figure 5:
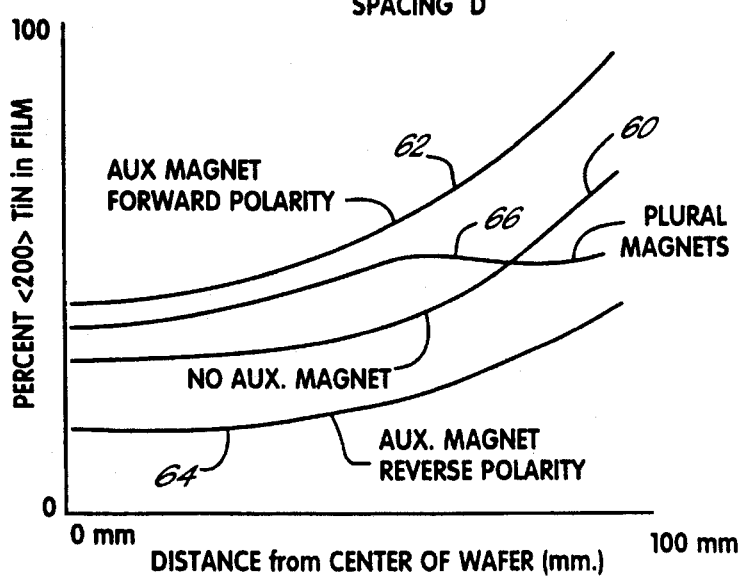
FIG. 5 is a graph of the percentage of <200> crystal orientation in the deposited film as a function of distance from the center of the wafer for various countermagnet configuration parameters.

In graph 60 of FIG. 5, the <200> to <111> crystal orientation ratio as a function of radius from the wafer center is illustrated without a counter-magnetic field 42, for an arbitrary spacing D, which may be any of the curves 50–52 of FIG. 3. With a counter-magnetic field applied of one polarity with a magnet 40 of the type of 40a of FIG. 1 or 40c of FIG. 2, the <200> ratio increases as in curve 62. When the same magnet 40 is employed with the opposite polarity, the ratio decreases, as illustrated in curve 64. By combining a plurality of magnets, such as 40a and 40b of FIG. 1, with different strengths and alternating polarity, for example, the uniformity of the <200> to <111> crystal orientation ratio across all radii of the wafer may be approached, as illustrated in curve 66 of FIG. 5. The adjustment of the magnet configuration is carried out in conjunct on with the adjustment of the spacing D to achieve he desired crystal orientation ratio and ratio uniformity.

In the preferred embodiment of the invention, a coating apparatus is provided that is effective for controlling the crystal orientation dependent properties of film such as titanium nitride during the chemical or reactive sputter deposition of the film onto a semiconductor wafer. The apparatus is provided with a wafer support in a vacuum chamber, which maintains a surface of the wafer to be coated in spaced parallel relationship with the sputtering surface of a target, made of sputter coating material such as titanium. In the chamber, a gas is maintained at a vacuum pressure level. In the case of titanium nitride film deposition, the gas may be a mixture of an inert gas such as argon with the reactive gas, nitrogen. With a magnet positioned behind the target, a magnetic trap is produced over the surface of the target and a magnetron enhanced plasma is generated in the gas under the arched magnetic field on the surface of the target. Preferably, the magnet is rotated to sweep the plasma around the center of the target.

The counter-magnetic field is generated with an auxiliary magnet positioned proximate the wafer. The counter-magnetic field produced has a substantial component generally perpendicular to the surface of the wafer that may vary, preferably as a function of the radius from the center of the wafer. In the initial phase of the process of providing the apparatus, the magnet configuration and the wafer-to-target spacing are adjustable. The auxiliary magnet may have separate magnet components to vary the strength and shape of the magnetic field as a whole produced by the auxiliary magnet. This field may be varied as a function of the radius from the wafer center. As such, the uniformity of the effects of the auxiliary magnet and wafer-to-target spacing can be controlled.

Then, in the preferred embodiment of the method of the invention, the target is sputtered and the film formed on the wafer. For TiN film deposition, titanium is sputtered from the target and reacted with the nitrogen gas at the surface of the wafer to form a polycrystaline titanium nitride film on the wafer. This film is made up of crystals of <200> and <111> orientation. This crystal orientation is measured. For TiN, the measured quantity is the ratio of <200> to <111> crystal orientation. The measurement preferably includes several measurements taken at different radii on the wafer. In response to the measurements, the wafer-to-target spacing and the auxiliary magnet configuration are both adjusted, then another wafer is coated and measurements retaken, and then the adjustment and measurements are repeated until the desired crystal orientation is achieved with a desired uniformity over the surface of the wafer. When the desired properties are achieved, the adjustments are either fixed, or they are recorded so that they can be reproduced in production of coated wafers of the desired properties, thereby establishing wafer-to-target criteria and magnet configuration criteria to achieve the properties desired.

The production of wafers, in the preferred embodiment of the invention, is carried out with the apparatus provided-as adjusted, by sequentially supporting a series of semiconductor wafers one-by-one in the vacuum chamber spaced from a target in accordance with wafer-to-target spacing criteria, and with the auxiliary magnet configured in accordance with the magnet configuration criteria.

In accordance with the present invention, the crystal orientation of the film is controlled by the method and apparatus as described above, and related properties such as resistivity of the deposited film, stress in the deposited film or diffusion barrier effectiveness of the deposited film, are controlled as desired.

TiN film produced in accordance with the preferred embodiment of the invention will possess a polycrystaline structure that will include some crystals of a <111> crystal orientation and some crystals of a <200> crystal orientation. The ratio of crystal <200> to <111> orientation in the formed film will be related to the resistivity of the formed film, the stress residing in the formed film and the diffusion barrier effectiveness of the film. The resulting ratio of <200> crystal orientation to <111> crystal orientation, as well as resistivity, stress and barrier quality, will vary in the wafers produced in accordance with the variations in the target-to-wafer spacing and the counter-magnetic field strength used during the film deposition process. As a result, the desired properties of the deposited film are produced.

Only certain embodiments of the invention have been herein described, but those skilled in the art will appreciate that various additions, alternatives or modifications to that described may be employed without departing from the principles of the present invention.

Accordingly, what is claimed is:

1. A method of providing a coating apparatus for controlling the crystal orientation dependent properties of a titanium nitride film on a semiconductor wafer, the method comprising the steps of:

a) supporting a semiconductor wafer in a vacuum chamber with a surface thereof to be coated maintained in spaced parallel relationship with a surface of a titanium target;

b) maintaining a mixture of inert gas and nitrogen gas at a vacuum pressure level within the chamber;

c) producing, with a magnet positioned behind the target, a magnetic trap over the surface of the target and generating a magnetron enhanced plasma in the gas between the trap and the target;

d) generating, with an auxiliary magnet positioned proximate the wafer, a counter-magnetic field;

e) sputtering titanium from the target in the gas mixture;

f) reacting the sputtered titanium with the nitrogen gas at the surface the wafer to form a titanium nitride film on the wafer;

g) measuring the crystal orientation of the formed titanium nitride film on the surface of the wafer;

h) adjusting, in response to the measuring step, the wafer-to-target spacing and the counter-magnetic field such that the ratio of <200> to <111> crystal orientation in the formed titanium nitride film over the surface of a wafer changes;

i) repeating steps a) through g);

j) repeating steps h) and i) until a given ratio of <200> to <111> crystal orientation of given uniformity is measured over the surface of the wafer, and thereby establishing a wafer-to-target spacing criteria and a magnet configuration criteria in accordance with the adjusting step; and k) providing a vacuum chamber having a target and wafer support spaced in accordance with the wafer-to-target spacing criteria and magnets Configured in accordance with the magnet configuration criteria.

2. The method of claim 1 wherein the magnetic trap producing and plasma generating step includes the step of:

producing, with a rotating permanent magnet positioned behind the target, the magnetic trap and rotating the trap over the surface of the target such that the magnetron enhanced plasma generated rotates over the surface of the target.

3. The method of claim 1 wherein the adjusting steps include the step of varying at least one of the properties of the formed titanium nitride film from a group of properties consisting of the film resistivity, film stress and film barrier quality.

4. The method of claim 1 wherein the counter-magnetic field generating step includes the step of generating the counter-magnetic field with an auxiliary magnet having at least a portion thereof configured in a ring positioned around the periphery of the wafer.

5. The method of claim 1 wherein the counter-magnetic field generating step includes the step of generating the counter-magnetic field that varies over the surface of the wafer as a function of the distance from the center of the wafer.

6. A method of manufacturing titanium nitride film coated semiconductor wafers comprising the steps of:

providing a coating apparatus for controlling the crystal orientation dependent properties of a titanium nitride film on a semiconductor wafer, by;

a) supporting a semiconductor wafer in a vacuum chamber with a surface thereof to be coated maintained in spaced parallel relationship with a surface of a titanium target;

b) maintaining a mixture of inert gas and nitrogen gas at a vacuum pressure level within the chamber;

c) producing, with a magnet positioned behind the target, a magnetic trap over the surface of the target and generating a magnetron enhanced plasma in the gas between the trap and the target;

d) generating, with an auxiliary magnet positioned proximate the wafer, a counter-magnetic field;

e) sputtering titanium from the target in the gas mixture;

f) reacting the sputtered titanium with the nitrogen gas at the surface of the wafer to form a titanium nitride film on the wafer;

g) measuring the crystal orientation of the formed titanium nitride film on the surface of the wafer;

h) adjusting, in response to the measuring step, the wafer-to-target spacing and the counter-magnetic field such that the ratio of <200> to <111> crystal orientation in the formed titanium nitride film over the surface of a wafer changes;

i) repeating steps a) through g);

j) repeating steps h) and i) until a given ratio of <200> to <111> crystal orientation of given uniformity is measured over the surface of the wafer, and thereby establishing a wafer-to-target spacing criteria and a magnet configuration criteria in accordance with the adjusting step; and k) providing a vacuum chamber having a target and wafer support spaced in accordance with the wafer-to-target spacing criteria and magnets configured in accordance with the magnet configuration criteria; then:

l) sequentially supporting a series of semiconductor wafers one-by-one in the vacuum chamber spaced in accordance with the wafer-to-target spacing criteria from a titanium target; then, for each wafer so supported:

m) maintaining a mixture of inert gas and nitrogen gas at a vacuum pressure level within the chamber;

n) producing, with the magnet positioned behind the target, a magnetic trap over the surface of the target and generating a magnetron enhanced plasma in the gas between the trap and the target;

o) generating a counter-magnetic field with the auxiliary magnet having a configuration in accordance with the magnet configuration criteria and positioned proximate the wafer; and p) sputtering titanium from the target in the gas mixture; and q) reacting the sputtered titanium with the nitrogen gas at the surface of the wafer to form a titanium nitride film on the wafer in accordance with the given ratio of crystal orientation and given uniformity.

7. A method of providing a coating apparatus for controlling the crystal orientation dependent properties of a film during the vacuum deposition thereof onto a semiconductor wafer, the method comprising the steps of:

a) supporting a semiconductor wafer in a vacuum chamber with a surface thereof to be coated maintained in spaced parallel relationship with a surface of a target;

b) maintaining a gas at a vacuum pressure level within the chamber;

c) producing, with a magnet positioned behind the target, a magnetic trap over the surface of the target and generating a magnetron enhanced plasma in the gas between the wafer and the target;

d) generating, with an auxiliary magnet positioned proximate the wafer, a counter-magnetic field;

e) sputtering from the target and onto the wafer material having a tendency to form a film of more than one crystal orientation as a function of deposition criteria;

f) measuring the crystal orientation of the formed film on the surface of the wafer;

g) adjusting, in response to the measuring step, the wafer-to-target spacing and the counter-magnetic field such that the crystal orientation in the formed film over the surface of a wafer changes;

h) repeating steps a) through g);

i) repeating steps g) and h) until a given crystal orientation of given uniformity is measured over the surface of the wafer, and thereby establishing a wafer-to-target spacing criteria and a magnet configuration criteria in accordance with the adjusting step; and j) providing a coating apparatus that includes a vacuum chamber having a target and wafer support spaced in accordance with the wafer-to-target spacing criteria and magnets configured in accordance with the magnet configuration criteria.

8. The method of claim 7 wherein the magnetic trap producing and plasma generating step includes the step of:

producing, with a rotating permanent magnet positioned behind the target, the magnetic trap and rotating the trap over the surface of the target such that the magnetron enhanced plasma generated rotates over the surface of the target.

9. The method of claim 7 wherein the adjusting steps include the step of varying at least one of the properties of the formed film from a group of properties consisting of the film resistivity, film stress and film barrier quality.

10. The method of claim 7 wherein the counter-magnetic field generating step includes the step of generating the counter-magnetic field with an auxiliary magnet having at least a portion thereof configured in a ring positioned around the periphery of the wafer.

11. The method of claim 7 wherein the counter-magnetic field generating step includes the step of generating the counter-magnetic field that varies over the surface of the wafer as a function of the distance from the center of the wafer.

12. A method of manufacturing film coated semiconductor wafers comprising the steps of:

providing a coating apparatus for controlling the crystal orientation dependent properties of a film on a semiconductor wafer, by:

a) supporting a semiconductor wafer in a vacuum chamber with a surface thereof to be coated maintained in spaced parallel relationship with a surface of a target;

b) maintaining a gas at a vacuum pressure level within the chamber;

c) producing, with a magnet positioned behind the target, a magnetic trap over the surface of the target and generating a magnetron enhanced plasma in the gas between the wafer and the target;

d) generating, with an auxiliary magnet positioned proximate the wafer, a counter-magnetic field;

e) sputtering from the target and onto the wafer material having a tendency to form a film of more than one crystal orientation as a function of deposition criteria;

f) measuring the crystal orientation of the formed film on the surface of the wafer;

g) adjusting, in response to the measuring step, the wafer-to-target spacing and the counter-magnetic field such that the crystal orientation in the formed film over the surface of a wafer changes;

h) repeating steps a) through g);

i) repeating steps g) and h) until a given crystal orientation of given uniformity is measured over the surface of the wafer, and thereby establishing a wafer-to-target spacing criteria and a magnet configuration criteria in accordance with the adjusting step; and j) providing a coating apparatus that includes a vacuum chamber having a target and wafer support spaced in accordance with the wafer-to-target spacing criteria and magnets configured in accordance with the magnet configuration criteria; then:

k) sequentially supporting a series of semiconductor wafers one-by-one in the vacuum chamber spaced in accordance with the wafer-to-target spacing criteria from a titanium target; then, for each wafer so supported:

l) producing, with the magnet positioned behind the target, a magnetic trap over the surface of the target and generating a magnetron enhanced plasma in the gas between the trap and the target;

m) generating a counter-magnetic field with the auxiliary magnet having a configuration in accordance with the magnet configuration criteria and positioned proximate the wafer; and n) sputtering material from the target and forming a film therewith on the surface of the wafer in accordance with the given crystal orientation and uniformity.

13. A method of manufacturing a coated semiconductor wafer with a thin film thereon having a given crystal orientation distributed over the surface thereof, the method comprising the steps of:

providing a coating apparatus having means therein for supporting a semiconductor wafer in a vacuum chamber with a surface thereof to be coated maintained in spaced parallel relationship with a surface of a target in accordance with a wafer-to-target spacing criteria, a magnet positioned behind the target, configured to produce a magnetic trap over the surface of the target and generating a magnetron enhanced plasma in the gas between the trap and the target, and an auxiliary magnet positioned proximate the wafer and configured in accordance with magnet configuration criteria to produce a counter-magnetic field;

the wafer-to-target spacing criteria and the magnet configuration criteria being established by:

a) sputtering from the target and onto the wafer material having a tendency to form a film of more than one crystal orientation as a function of deposition criteria;

b) measuring the crystal orientation of a film formed of the material on the surface of the wafer;

c) adjusting, in response to the measuring step, the wafer-to-target spacing and the counter-magnetic field such that the crystal orientation in the formed film over the surface of a wafer changes;

d) repeating steps a) through c); and e) repeating steps c) and d) until a given crystal orientation of a given uniformity is measured over the surface of the wafer, and thereby establishing the wafer-to-target spacing criteria and the magnet configuration criteria in accordance with the adjusting step;

sequentially supporting a series of semiconductor wafers one-by-one in the vacuum chamber of the coating apparatus spaced in accordance with the wafer-to-target spacing criteria from a target therein;

then, for each wafer so supported:

f) producing, with the magnet positioned behind the target, a magnetic trap over the surface of the target and generating a magnetron enhanced plasma between the trap and the target;

g) generating a counter-magnetic field with the auxiliary magnet having a configuration in accordance with the magnet configuration criteria and positioned proximate the wafer; and h) sputtering material from the target and forming a film therewith on the surface of the wafer.

14. The method of claim 13 wherein the magnetic trap producing and plasma generating steps include the step of:

producing, with a rotating permanent magnet positioned behind the target, the magnetic trap and rotating the trap over the surface of the target such that the magnetron enhanced plasma generated rotates over the surface of the target.

15. The method of claim 13 wherein the material sputtering and film forming step includes the step of reacting the sputtered material with a gas at the surface of the wafer to form the film.

16. The method of claim 13 wherein the counter-magnetic field generating step includes the step of generating the counter-magnetic field with an auxiliary magnet having at least a portion thereof configured in a ring positioned around the periphery of the wafer.

17. The method of claim 13 wherein the counter-magnetic field generating step includes the step of generating the counter-magnetic field that varies over the surface of the wafer as a function of the distance from the center of the wafer.

* * * * *